United States Patent
Huang et al.

(10) Patent No.: US 7,334,690 B2
(45) Date of Patent: Feb. 26, 2008

(54) SUBSTRATE SUPPORTING ROD AND SUBSTRATE CASSETTE USING THE SAME

(75) Inventors: Chun-Kai Huang, Miao-Lih (TW); Wei-Cheng Tien, Miao-Lih (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 208 days.

(21) Appl. No.: 10/910,071

(22) Filed: Aug. 2, 2004

(65) Prior Publication Data

US 2005/0023231 A1   Feb. 3, 2005

(30) Foreign Application Priority Data

Aug. 1, 2003   (TW) .............................. 92121175 A (51) Int. Cl.
*A47G 19/08*   (2006.01)
*B65D 85/48*   (2006.01)

(52) U.S. Cl. ...................... 211/41.18; 211/26; 206/454; 206/711; 118/500

(58) Field of Classification Search ................ 211/26, 211/40, 41.12, 41.14, 41.17, 41.18; 206/711, 206/454, 455, 456; 118/728
See application file for complete search history.

(56) References Cited

U.S. PATENT DOCUMENTS

| | | | | |
|---|---|---|---|---|
| 4,872,554 A | * | 10/1989 | Quernemoen | 206/454 |
| 5,492,229 A | * | 2/1996 | Tanaka et al. | 211/41.18 |
| 5,584,401 A | * | 12/1996 | Yoshida | 211/41.1 |
| 5,853,214 A | * | 12/1998 | Babbs et al. | 294/161 |
| 5,858,103 A | * | 1/1999 | Nakajima et al. | 118/728 |
| 6,031,205 A | * | 2/2000 | Shimazu | 219/390 |
| 6,033,215 A | * | 3/2000 | Ohsawa | 432/258 |
| 6,092,981 A | * | 7/2000 | Pfeiffer et al. | 414/810 |
| 6,099,302 A | * | 8/2000 | Hong et al. | 432/259 |
| 6,186,344 B1 | * | 2/2001 | Park et al. | 211/41.1 |
| 6,237,979 B1 | * | 5/2001 | Korn et al. | 294/159 |
| 6,341,702 B1 | * | 1/2002 | MacKelvie | 211/40 |
| 6,357,432 B2 | * | 3/2002 | Zehavi et al. | 125/12 |
| 6,532,642 B1 | * | 3/2003 | Wingo | 29/558 |
| 6,617,540 B2 | * | 9/2003 | Zehavi | 219/121.64 |

(Continued)

FOREIGN PATENT DOCUMENTS

CN   09111024744   * 12/2002

(Continued)

*Primary Examiner*—Richard E. Chilcot, Jr.
*Assistant Examiner*—Jared W. Newton
(74) *Attorney, Agent, or Firm*—Wei Te Chung (57) ABSTRACT

A substrate-supporting rod (4) includes a resin body (41) and a metal rod (43). The resin body (41) includes a body portion (411) being cylinder-shaped and having a first through hole (413) in a direction of the axis thereof, and a number of shelves (415, 415') arising from said body portion and extending in parallel away from said body portion at a predetermined pitch. The body portion and the number of shelves are unitary portions of the resin body. The metal rod is received in the first through hole. A projection (4151) is defined on the end of each of shelf to support a substrate (45). The projection is cylindrical in shape of which the diameter is larger than the thickness of the corresponding shelf, and a central axis thereof is substantially perpendicular to a central axis of the body portion.

22 Claims, 6 Drawing Sheets

U.S. PATENT DOCUMENTS

| | | | |
|---|---|---|---|
| 6,776,289 B1* | 8/2004 | Nyseth | 206/711 |
| 7,051,887 B2* | 5/2006 | Huang et al. | 211/183 |
| 2004/0069728 A1* | 4/2004 | Huang et al. | 211/41.18 |
| 2004/0108284 A1* | 6/2004 | Huang et al. | 211/41.18 |

FOREIGN PATENT DOCUMENTS

| | | |
|---|---|---|
| JP | 08-021612 | 3/1996 |
| TW | 542218 Y | 7/2003 |

* cited by examiner

SUBSTRATE SUPPORTING ROD AND SUBSTRATE CASSETTE USING THE SAME

BACKGROUND OF THE INVENTION

1. Field of the Invention

The present invention relates to a cassette for accommodating a plurality of substrates in mutual isolation. The invention further relates to a substrate supporting rod which is to be a functional member of said cassette.

2. Description of Related Art

Substrates such as glass substrates must be stored and taken out from a cassette in such a manner that the plural substrates will not contact with each other.

The cassette in common use comprises a box-shaped resin frame equipped with pairs of opposed resin side members each formed with grooves so that one and each substrate may be accommodated between grooves of the opposed side boards.

Figure 1:
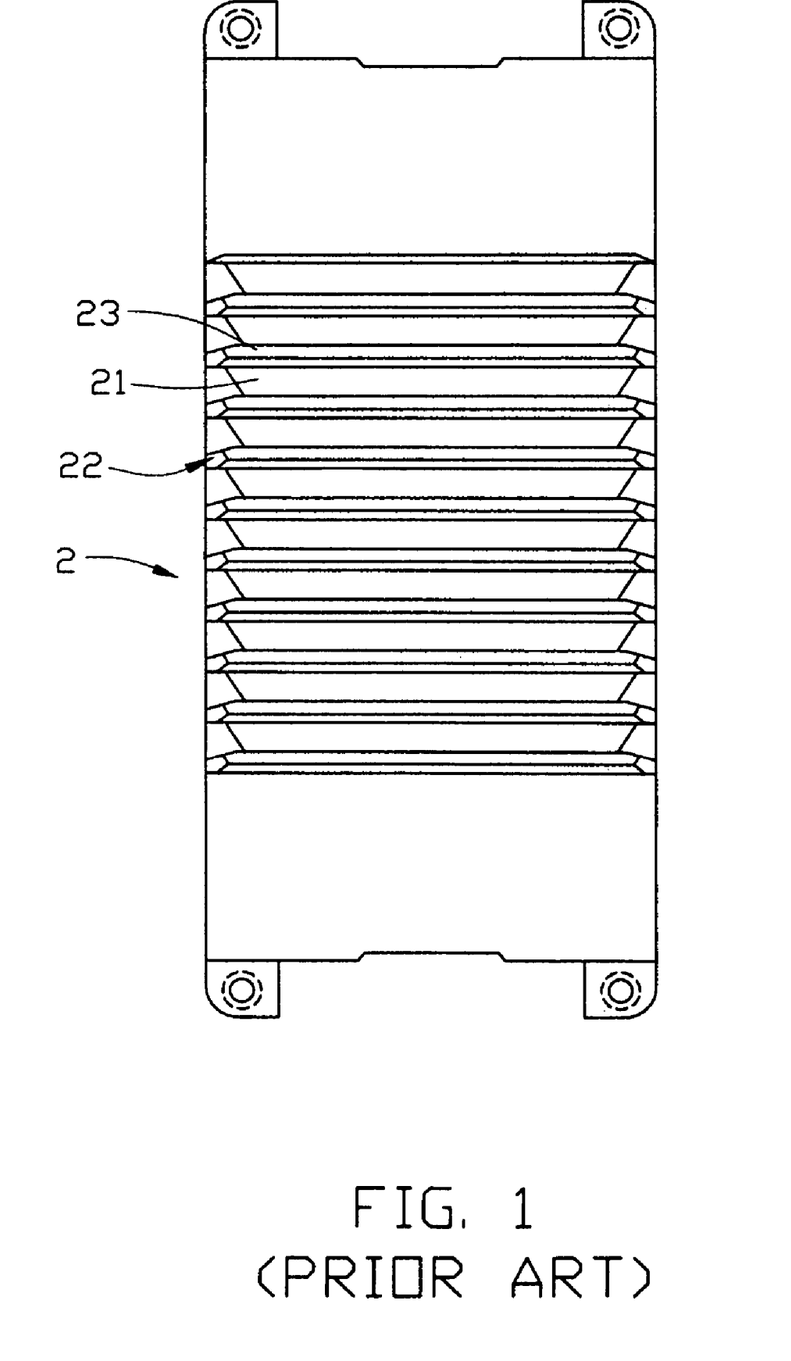
FIG. 1 is a front view of a conventional substrate-supporting board.
Figure 2:
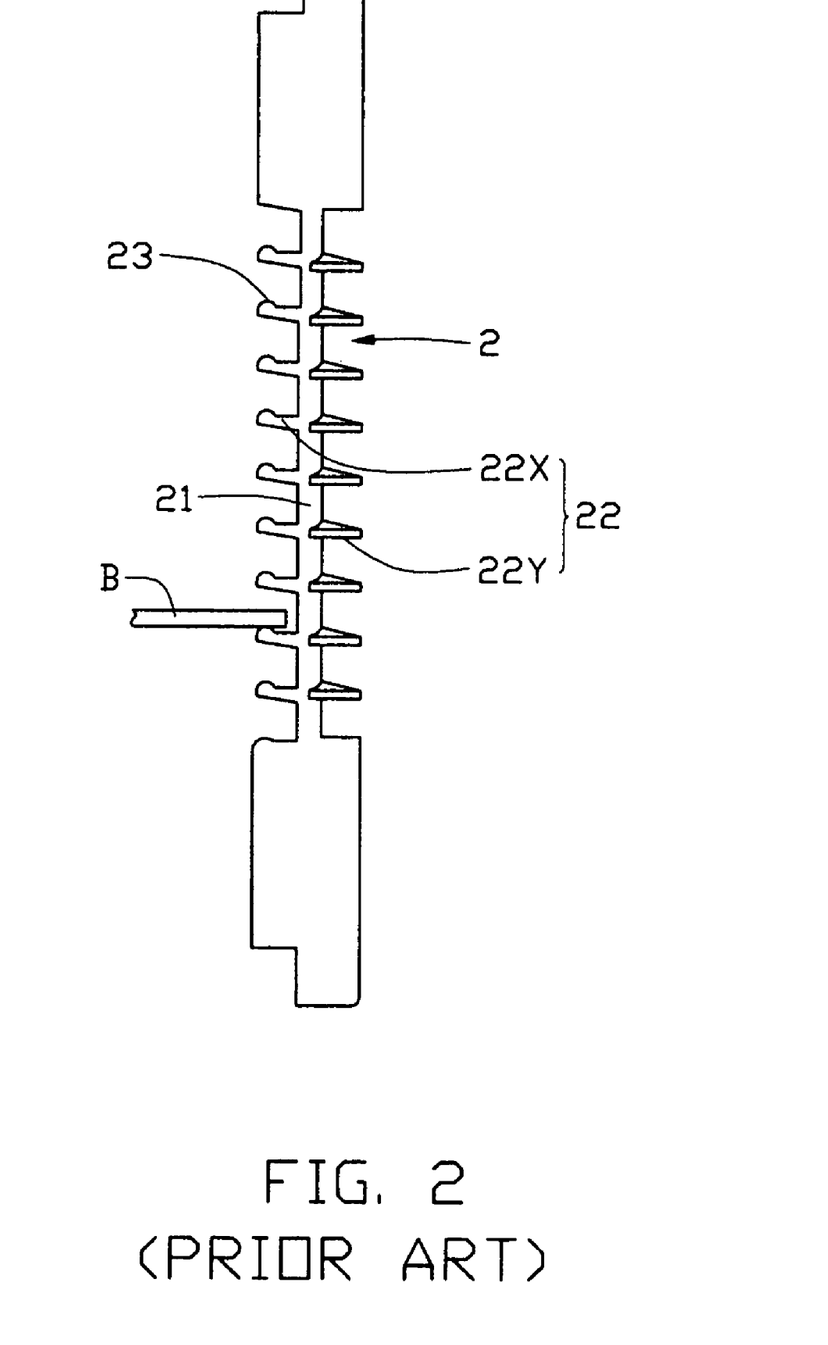
FIG. 2 is side elevational view of said substrate-supporting board of FIG. 1.

JP H 08-021612 discloses a cassette comprising a plurality of substrate-supporting boards 2 including a body 21 and a plurality of shelf members 22 extending in parallel from the body 21 at a predetermined pitch as illustrated in FIG. 1 and FIG. 2. The shelf member 22 comprises a first shelf 22X extending inwardly of the cassette and a second shelf 22Y extending outwardly of the cassette. In addition, a projection 23 is provided on the end of the first shelf 22X of which the highest portion is smooth curve surface. Although the projection 23 for supporting a substrate B leads to a decrease of dusts of friction between edges of the substrate B and the substrate-supporting board 2, the problem of static discharge can not be solved. Otherwise, for the substrate-supporting board 2 is a structure of board, not all parts of the first shelf 22X can be used for supporting the substrate B. Therefore, it is a waste of material on design.

Figures 3, 4:
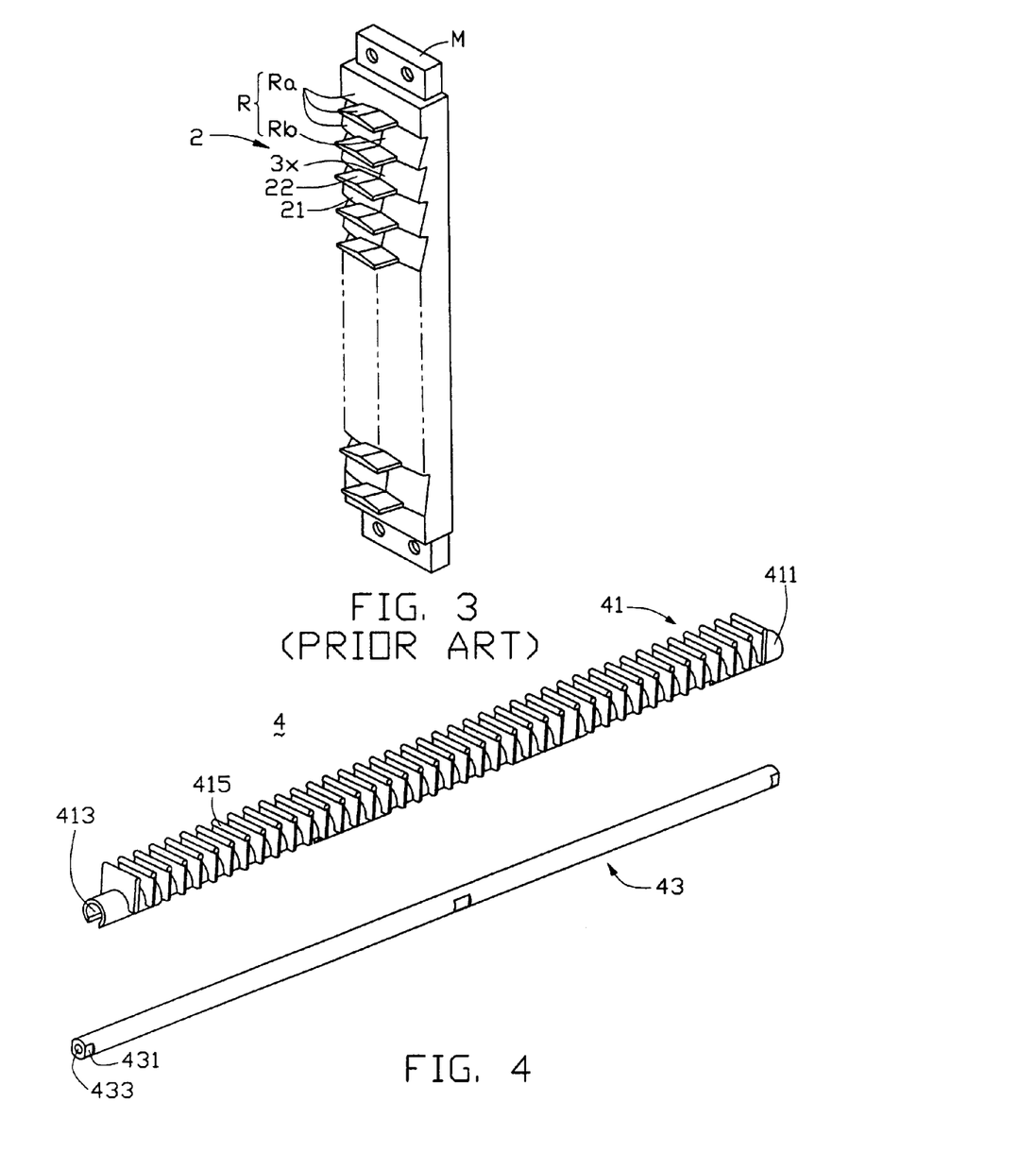
FIG. 3 is a perspective view of the substrate-supporting side boards of another conventional cassette.
FIG. 4 is a perspective expoded view showing a typical substrate-supporting rod according to the invention.

Referring to FIG. 3, another conventional cassette disclosed in the U.S. Pat. No. 5,584,401 has a plurality of substrate-supporting side boards 2 comprising a metal core M, an overlay 21 and a plurality of tongue-shaped shelf members 22, at least the frontal part of said overlay and the shelf members being made of resin, and at least a rib-like projection 3x extending centrally and longitudinally from the overlay being molded from a dust-inhibited resin molding material, with the remainder being molded from an electrically conductive resin molding material. Although said cassette is protected against static discharge in the insertion and removal of substrates and is not liable to form dusts such as the dust of friction due to friction against substrates, its whole structure is complex so that the cost of the fabrication is high.

Therefore, it is desirable to provide a cassette which both saves material and inhibits static discharge in the insertion and removal of substrates.

SUMMERY OF THE INVENTION

One object of the present invention is to provide a substrate supporting rod which is able to retrench material during fabrication.

Another object of the present invention is to provide a substrate-supporting rod which not only retrenches material but also can be protected against static discharge.

The third object of the present invention is to provide a cassette utilizing a plurality of the substrate-supporting rods saving material.

The last object of the present invention is to provide a cassette utilizing a plurality of the substrate-supporting rods, which both save material and inhibit static discharge.

In order to achieve the objects set forth, a substrate-supporting rod in accordance with the present invention comprises a resin body and a metal rod. The resin body includes a body portion being cylinder-shaped and having a first through hole in a direction of the axis thereof and a number of shelves arising from said body portion and extending in parallel and inwardly of a cassette at a predetermined pitch. The metal rod is received in the first through hole of the body portion so as to increase the rigidity of the substrate-supporting rod. A projection is defined on the end of each shelf to support a substrate. Further, the body portion is molded from an electrically conductive resin so that not only the cassette can be protected against static discharge but also resin material is saved and cost is decreased.

The detailed features of the present invention will be apparent in the detailed description with appropriate reference to the accompanying drawings.

DETAILED DESCRIPTION OF THE INVENTION

The present invention is now described in detail.

Referring to FIG. 4, a substrate-supporting rod 4 according to the present invention comprises a resin body 41 and a metal rod 43. The resin body 41 includes a body portion 411 being cylinder-shaped having a first through hole 413 in a direction of the axis thereof and a number of shelves 415 arising from and, as seen from e.g., FIGS. 4 and 5, supportably molded to said body portion 411 (i.e., the body portion 411 and the shelves 415 are unitary portions of the same resin body 41). The shelves 415 extend in parallel and inwardly of a cassette 5 at a predetermined pitch. The cross section of said body portion 411 is C-shaped in order to save material, while the cross section of said body portion 411 designed as being O-shaped is viable. The metal rod 43 comprises a pair of end portions 431 each of which having a pair of side faces (not labeled) parallel to each other and a threaded hole 433. The metal rod 43 is received in the first through hole 413 of the body portion 411 so as to increase the rigidity of the substrate-supporting rod 4.

Figure 5:
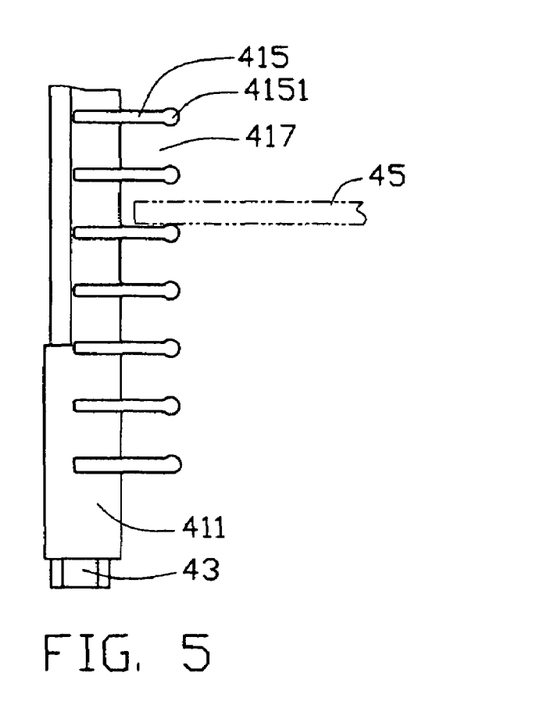
FIG. 5 is a schematic diagram showing the substrate-supporting rod cooperating with a substrate, in which a shelf of the substrate-supporting rod is perpendicular to the axis of a body portion.
Figure 6:
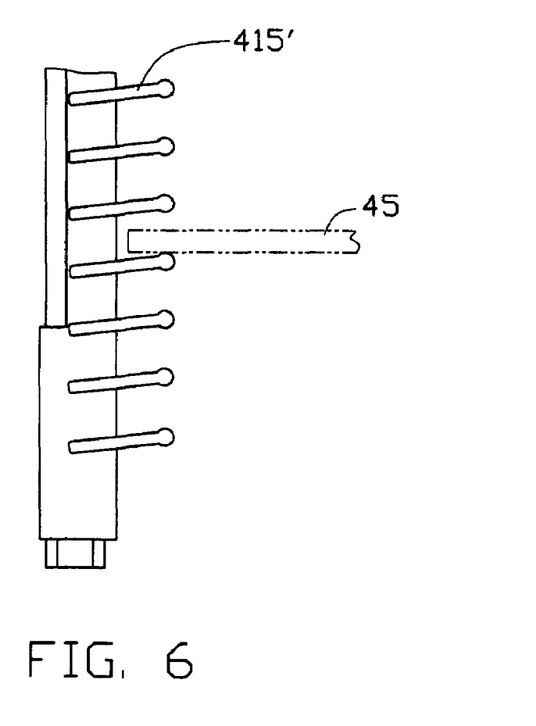
FIG. 6 is a schematic diagram showing the substrate-supporting rod cooperating with a substrate, in which a shelf of the substrate-supporting rod is slant relative to the axis of the body portion.

Referring to FIG. 5, a receiving passageway 417 is formed between adjacent shelves 415 of said rod 4 to accommodate a substrate 45. A projection 4151 extends at the free end of each of the shelves 415 for supporting a substrate 45. The projection 4151 is disposed as a shape of cylinder of which the diameter is larger than the thickness of the shelf 415, while only the highest portion of said projection 4151 being a smooth curve surface is certainly feasible. Furthermore, not only each of the shelves 415 can be disposed perpendicularly to the axis of the body portion 411 but also the shelf 415' can be configured at an upward inclination with respect to the axis of the body portion 411 as illustrated in FIG. 6.

In addition, the shelves 415 only extend from one side of the body portion 411. As a result the above construction leads to decrease of material and cost. Further, in accordance with the present invention, only the projection 4151 contacts with the bottom of the substrate 45 while the substrate 45 is being inserted into or removed off the corresponding receiving passageways 417, that is, edges of the substrate 45 do not contact with the shelf 415 or the body portion 411. The above construction of the projection 4151 leads to a marked decrease in dusts of friction at insertion or removal of the substrate 45.

The body portion 411 is molded from an electrically conductive resin, which is a dispersion of a particulate electrically conductive substance in a matrix resin. The electrically conductive substance includes but is not limited to carbon fiber and carbon powder. On the other hand, the metal rod 43 may for example be aluminum or stainless steel. Therefore, the substrate-supporting rod 4 can be protected against static discharge.

Figure 7:
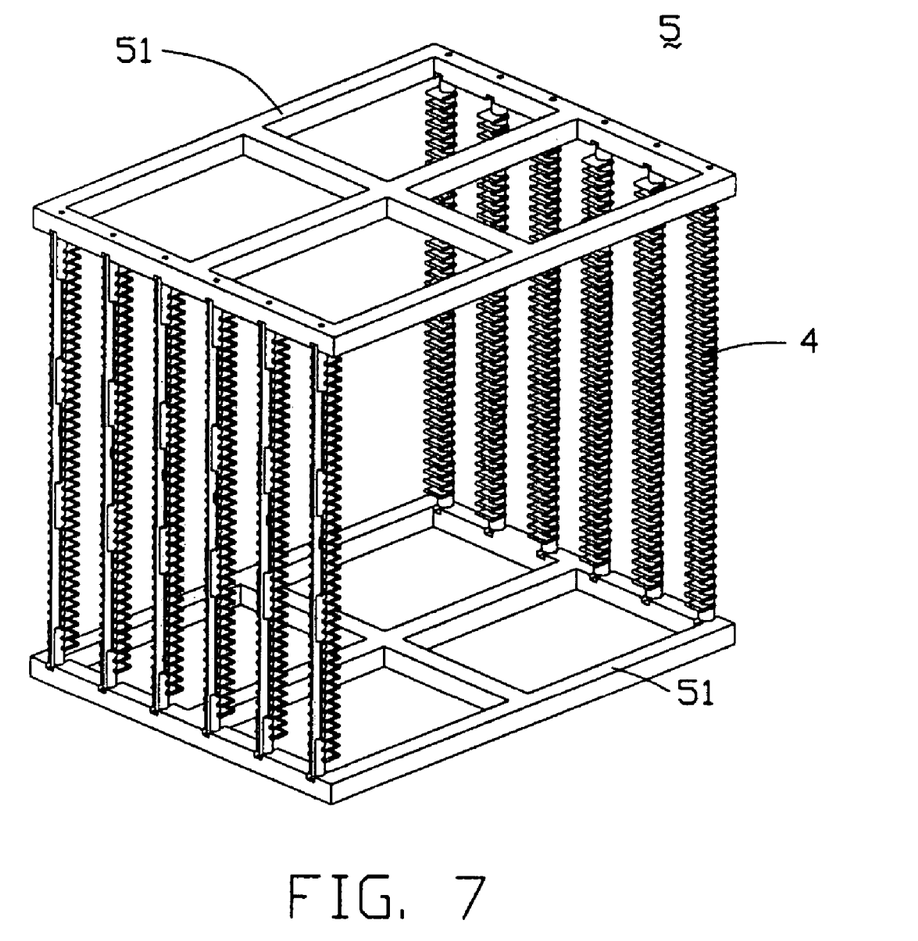
FIG. 7 is a perspective view of a cassette according to the invention.
Figure 8:
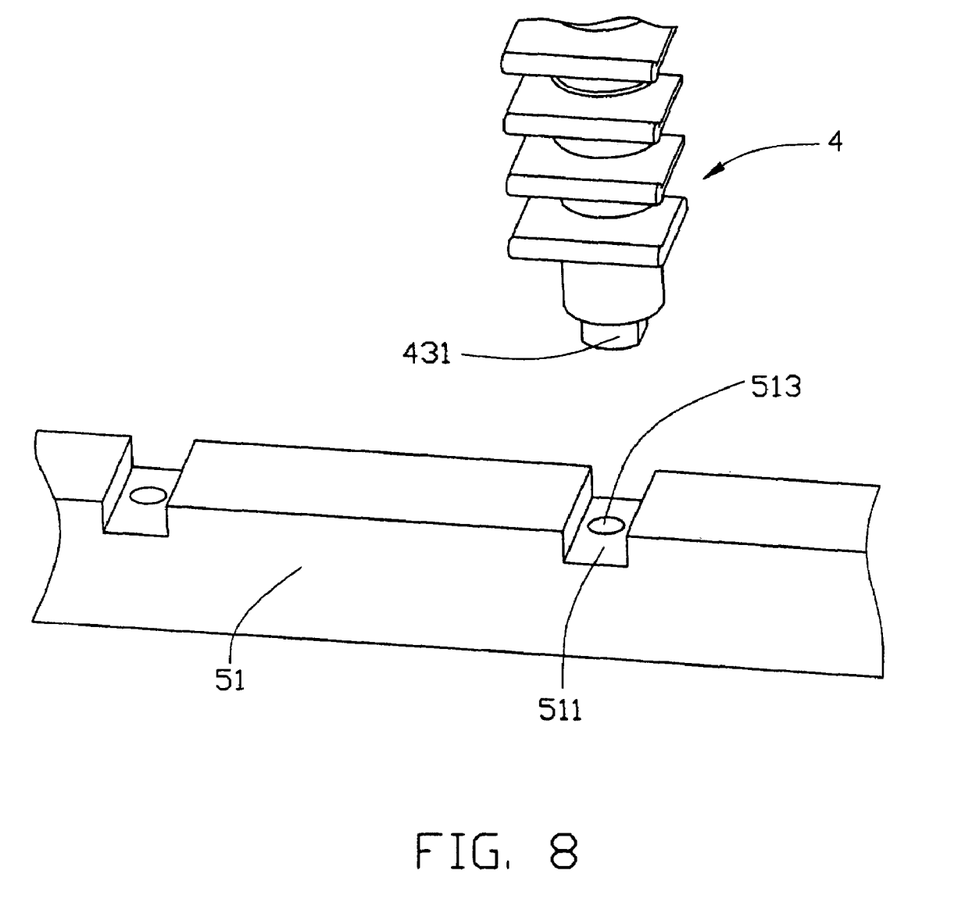
FIG. 8 is a schematic diagram illustrating the substrate-supporting rod conjugating with a frame.

Then, referring to FIG. 7, the cassette 5 comprises a pair of frames 51 configured with at least two pairs of substrate-supporting rods 4 in the overall shape of a box for accommodating a substrate 45 between the shelves 415 of each opposed pair of the rods 4. The frame 51 illustrated in FIG. 8 is provided with several grooves 511 on each of which a second through hole 513 is disposed. The groove 511 includes a pair of side faces parallel to each other, between which the distance is comparative to that between the pair of side faces of end portion 431 of the metal rod 43. The substrate-supporting rod 4 is secured on the frame 51 by insertion of the end portion 431 into the groove 511 so as to preventing the metal rod 43 from rotating with respect to the frame 51 and further by a bolt combination with the threaded hole 433 of the metal rod 43 through the second through hole 513 on the frame 51. Furthermore, to prevent the resin body 41 from rotating relative to the metal rod 43, another bolt is introduced.

To sum up, according to the present invention, the substrate-supporting rod 4 of the cassette 5 is cylindrical in shape different from the common structure of board so that resin material is saved and cost is decreased. Further, the body portion 411 is molded from an electrically conductive resin so that the cassette 5 can be protected against static discharge.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A substrate-supporting rod to be assembled with a cassette frame for supporting substrates, the substrate-supporting rod comprising:
   a resin body which comprises a cylindrical body portion having an axial first through hole and a number of shelves, the number of shelves arising from said body portion and extending away from said body portion in parallel to one another at a predetermined pitch, said body portion and the number of shelves being unitary portions of the resin body; and
   a metal rod being received in said first through hole of said body portion;
   wherein each of the shelves is provided with a projection extending at a free end thereof, said projection is cylindrical in shape of which the diameter is larger than the thickness of the shelf, and a central axis of said projection is substantially perpendicular to a central axis of the body portion.

2. The substrate-supporting rod according to claim 1, wherein said body portion is molded from an electrically conductive resin molding material.

3. The substrate-supporting rod according to claim 2, wherein the cross section of said body portion is C-shaped.

4. The substrate-supporting rod as claimed in claim 3, wherein said projection comprises a highest portion having a smooth curved surface.

5. The substrate-supporting rod according to claim 3, wherein each of the shelves extends perpendicularly to the central axis of the body portion.

6. The substrate-supporting rod according to claim 3, wherein each of the shelves is upward inclined relative to the central axis of the body portion.

7. The substrate-supporting rod as claimed in claim 1, wherein said projection comprises a highest portion having a smooth curved surface.

8. The substrate-supporting rod according to claim 1, wherein each of the shelves extends perpendicularly to the central axis of the body portion.

9. The substrate-supporting rod according to claim 1, wherein each of the shelves is upward inclined relative to the central axis of the body portion.

10. The substrate-supporting rod according to claim 1, wherein the cross section of said body portion is C-shaped.

11. The substrate-supporting rod according to claim 1, wherein the cross section of said body portion is O-shaped.

12. The substrate-supporting rod according to claim 1, wherein the metal rod comprises a pair of end portions each of which having a pair of side faces parallel to each other and a treaded hole.

13. A cassette configured for supporting a substrate, comprising:
   at least two pairs of supporting rods, each rod comprising:
      a resin body which comprises a cylindrical body portion having an axial first through hole and a number of shelves, the number of shelves arising from said body portion and extending in parallel to one another at a predetermined pitch, said body portion and the number of shelves being unitary portions of the resin body; and
      a metal rod being received in said first through hole of the body portion;
      wherein each of the shelves is provided with a projection extending at a free end thereof, said projection is cylindrical in shape of which the diameter is larger than the thickness of the shelf, and a central axis of said projection is substantially perpendicular to a central axis of the body portion; and a pair of frames cooperating with the supporting rods in the overall shape of a box for accommodating a substrate between the shelves of each opposed pair of supporting rods.

14. The cassette as claimed in claim 13, wherein said body portion is molded from an electrically conductive resin molding material.

15. The cassette according to claim 13, wherein said projection comprises a highest portion having a smooth curved surface.

16. The cassette according to claim 13, wherein each of the shelves extends perpendicularly to the central axis of the body portion.

17. The cassette according to claim 13, wherein each of the shelves is upward inclined relative to the central axis of the body portion.

18. The cassette as claimed in claim 13, wherein the cross section of said body portion is C-shaped.

19. The cassette as claimed in claim 13, wherein the cross section of said body portion is O-shaped.

20. The cassette as claimed in claim 13, wherein the metal rod comprises a pair of end portions each of which having a pair of side faces parallel to each other and a threaded hole.

21. The cassette as claimed in claim 13, wherein each of the frames is provided with several grooves, each of which matches with the end portion of the metal rod.

22. The cassette as claimed in claim 21, wherein each of the grooves is provided with a second through hole secured with the threaded hole of the end portion of the metal rod.

* * * * *